(12) United States Patent
Khandelwal et al.

(10) Patent No.: US 10,028,414 B2
(45) Date of Patent: Jul. 17, 2018

(54) PASSIVE COOLING FEATURES FOR ELECTRONICS EQUIPMENT CABINETS

(71) Applicant: Emerson Network Power, Energy Systems, North America, Inc., Warrenville, IL (US)

(72) Inventors: Adarsh Khandelwal, Pune (IN); Srinivasan Natarajan, Anthiyur (IN); James William Webster, Addison, IL (US); Arunkumar Biragoni, Karim Nagar (IN)

(73) Assignee: VERTIV ENERGY SYSTEMS, INC., Lombard, IL (US)

( * ) Notice: Subject to any disclaimer, the term of this patent is extended or adjusted under 35 U.S.C. 154(b) by 0 days.

(21) Appl. No.: 14/748,476

(22) Filed: Jun. 24, 2015

(65) Prior Publication Data

US 2015/0373872 A1   Dec. 24, 2015

(30) Foreign Application Priority Data

Jun. 24, 2014  (IN) .......................... 2031/MUM/2014
Feb. 5, 2015   (IN) ........................... 380/MUM/2015

(51) Int. Cl.
*H05K 7/20*        (2006.01)
(52) U.S. Cl.
CPC ................. *H05K 7/20572* (2013.01)
(58) Field of Classification Search
CPC ............. H05K 7/202; H05K 7/20136; H05K 7/20145; H05K 7/20752
USPC ........................................ 361/695
See application file for complete search history.

(56) References Cited

U.S. PATENT DOCUMENTS

| | | | | |
|---|---|---|---|---|
| 4,794,487 A * | 12/1988 | Maschek | ............ | H05K 7/20009 174/16.1 |
| 6,222,729 B1 * | 4/2001 | Yoshikawa | ........ | H05K 7/20154 174/16.1 |
| 6,678,156 B2 * | 1/2004 | Moizer | ............. | H05K 7/20572 312/236 |
| 6,889,752 B2 * | 5/2005 | Stoller | ................... | H05K 7/206 165/122 |
| 7,589,436 B2 * | 9/2009 | Takahashi | ................ | G06F 1/30 307/112 |
| 2010/0171400 A1 * | 7/2010 | Hill | .................... | H05K 7/20618 312/236 |
| 2011/0203770 A1 * | 8/2011 | Rowe | ..................... | H05K 7/202 165/80.1 |

\* cited by examiner

*Primary Examiner* — Mukund G Patel
(74) *Attorney, Agent, or Firm* — Harness, Dickey & Pierce, P.L.C.

(57) ABSTRACT

An electronics equipment cabinet includes a plurality of walls defining a first space and a second space adjacent the first space. A wall of the plurality of walls separates the first space and the second space and includes an opening. The cabinet further includes a heat generating module having an inlet side, an outlet side opposing the inlet side, a heat generating component between the inlet side and the outlet side, and an internal fan for directing air heated by the heat generating component into the second space via the opening of the wall. One or more walls of the plurality of walls defining the second space includes a thermally conductive material for transferring heat from the second space to a surrounding environment external to the cabinet to reduce a temperature in the cabinet. Other example cabinets and methods for reducing temperature in cabinets are also disclosed.

20 Claims, 4 Drawing Sheets

PASSIVE COOLING FEATURES FOR ELECTRONICS EQUIPMENT CABINETS

CROSS-REFERENCE TO RELATED APPLICATIONS

This application claims the benefit of Indian Application No. 2031/MUM/2014 filed Jun. 24, 2014 and Indian Application No. 380/MUM/2015 filed Feb. 5, 2015. The entire disclosure of each of the above applications is incorporated herein by reference.

FIELD

The present disclosure relates to passive cooling features for electronics equipment cabinets.

BACKGROUND

This section provides background information related to the present disclosure which is not necessarily prior art.

Telecommunications cabinets (sometimes referred to as enclosures) commonly house electronic components. These cabinets typically protect the electronic components against a wide variety of environmental hazards and maintain a desired internal temperature. To maintain this temperature, the cabinets commonly use openings on exterior walls for venting air, heat exchanger(s), etc.

Figure 1:
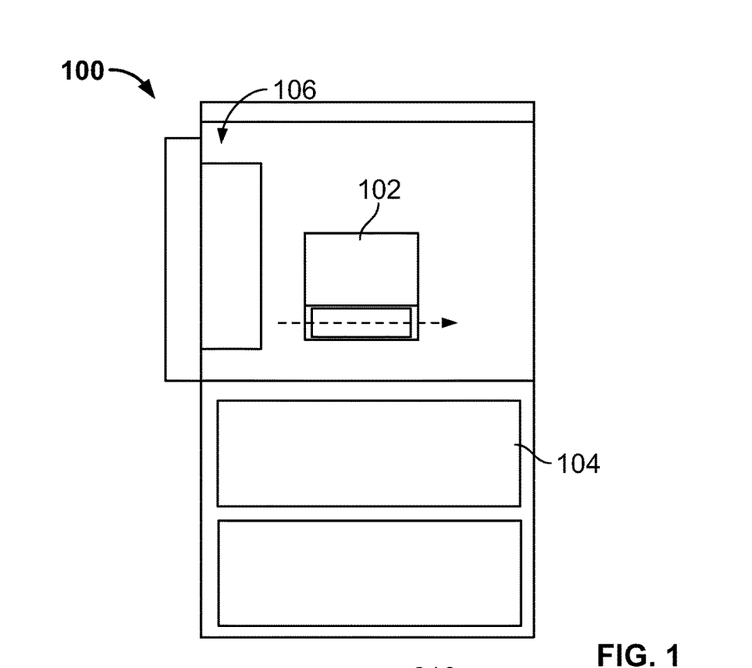
FIG. 1 is a side view of a conventional telecommunications cabinet including a heat exchanger for maintaining a temperature in the cabinet below a threshold temperature.

For example, FIG. 1 illustrates a conventional telecommunications cabinet 100 including electronic components (e.g., a rectifier 102 and batteries 104) and a heat exchanger 106 to maintain a temperature in the cabinet 100 below a threshold temperature.

SUMMARY

This section provides a general summary of the disclosure, and is not a comprehensive disclosure of its full scope or all of its features.

According to one aspect of the present disclosure, an electronics equipment cabinet for housing one or more heat generating components includes a plurality of walls defining a first space of the electronics equipment cabinet configured to house one or more heat generating components and a second space of the electronics equipment cabinet adjacent the first space. At least one wall of the plurality of walls separates the first space and the second space and includes an opening. The cabinet further includes at least one heat generating module positioned in the first space. The at least one heat generating module includes an inlet side, an outlet side opposing the inlet side, a heat generating component between the inlet side and the outlet side, and an internal fan for directing air heated by the heat generating component into the second space via the opening of the at least one wall. One or more walls of the plurality of walls defining the second space include a thermally conductive material for transferring heat from the second space to a surrounding environment external to the electronics equipment cabinet to reduce a temperature in the cabinet.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
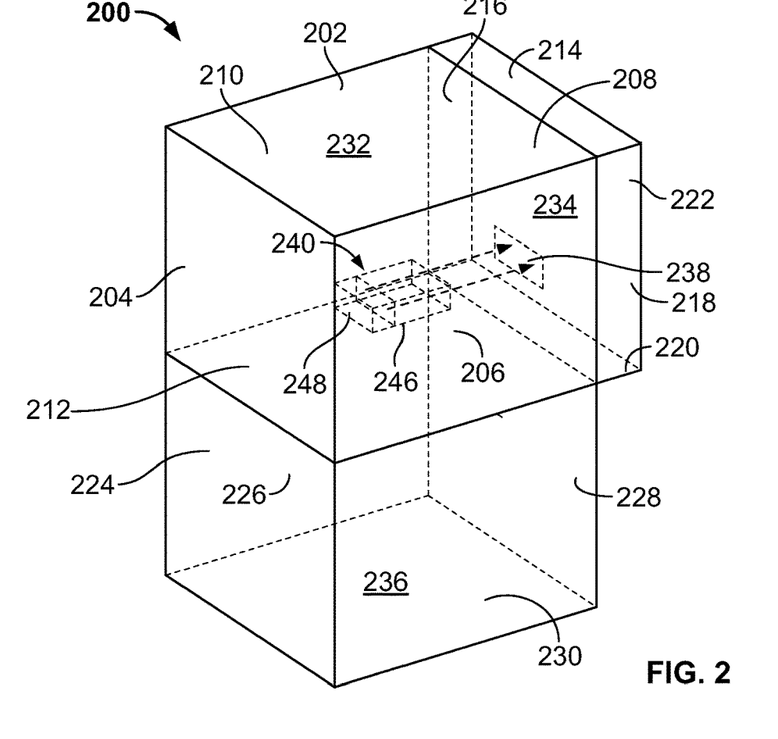
FIG. 2 is an isometric view of an electronics equipment cabinet having a fan directing air heated by a heat generating component from one space to another space via a wall opening according to one example embodiment of the present disclosure.
Figure 3:
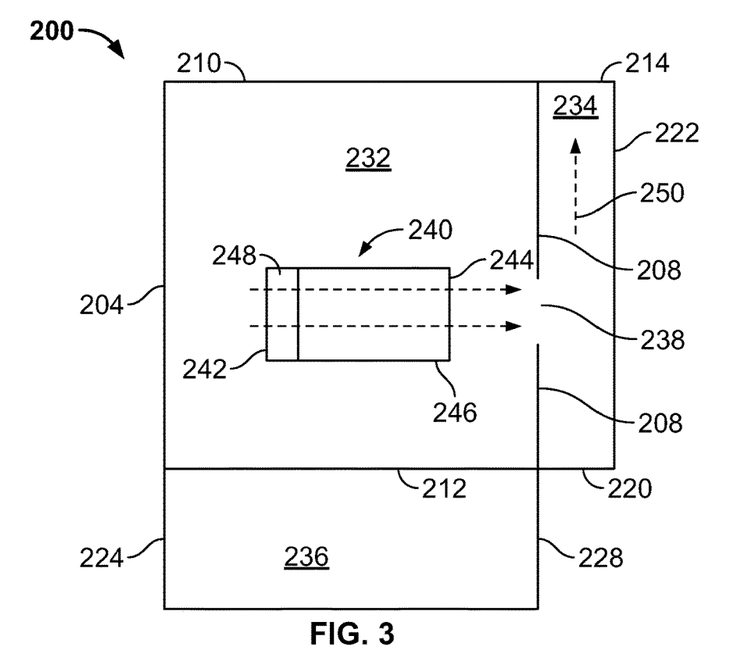
FIG. 3 is a side view of the cabinet of FIG. 2.

An electronics equipment cabinet for housing one or more heat generating components according to one example embodiment of the present disclosure is illustrated in FIGS. 2 and 3, and indicated generally by reference number 200. As shown in FIGS. 2 and 3, the cabinet 200 includes walls defining a space 232 (sometimes referred to as the main space) configured to house one or more heat generating components and a space 234 (sometimes referred to as the secondary space) adjacent the main space 232. One of the walls (i.e., a wall 208) separates the main space 232 and the secondary space 234, and includes an opening 238. The cabinet 200 further includes a heat generating module 240 positioned in the main space 232. The module 240 includes an inlet side 242, an outlet side 244 opposing the inlet side 242, a heat generating component 246 between the inlet side 242 and the outlet side 244, and an internal fan 248 for directing air heated by the heat generating component 246 into the secondary space 234 via the opening 238 of the wall 208. One or more of the walls defining the secondary space 234 include a thermally conductive material for transferring heat from the secondary space 234 to a surrounding environment external to the cabinet 200 to reduce a temperature in the cabinet 200.

In the example embodiment of FIGS. 2 and 3, the walls 202, 204, 206, 208, 210, 212 define the main space 232 and the walls 208, 214, 216, 218, 220, 222 define the secondary space 234. In some examples, the cabinet 200 may be considered a dual wall construction due to, for example, the wall 208 and the other walls defining the secondary space 234.

As shown in FIGS. 2 and 3, the opening 238 of the wall 208 is substantially aligned with the fan 248. For example, the fan 248 and the opening 238 may have substantially aligned central axes. In such examples, the cross sectional area of the chamber of air produced by the fan 248 may be substantially the same as the area of the opening 238. As such, air moved by the fan 248 and heated by the heat generating component(s) 246 may be advantageously directed into the secondary space 234 via the aligned opening 238 (as shown in FIGS. 2 and 3). In other embodiments, the opening 238 may not be aligned with the fan 248. For example, the opening 238 may be offset from the fan 248 (e.g., below the fan 248, to the side of the fan 248, etc.), etc.

The fan 248 of FIGS. 2 and 3 is positioned near the inlet side 242 of the heat generating module 240 and/or on an inlet side of the heat generating component 246 such that air moved by the fan is forced to pass by the heat generating component 246. In other embodiments, the fan 248 may be positioned near the outlet side 244, adjacent a middle portion of the module 240, on an outlet side of the heat generating component 246, etc. if desired.

After the heated air enters the secondary space 234, heat may be transferred from the cabinet 200 via convection, conduction, and/or radiation. For example, the heated air may rise to a top portion of the secondary space 234 passing along the walls 216, 218, 222 (indicated by arrow 250 of FIG. 3) and cooler air may sink towards a bottom portion of the secondary space 234. If, for example, the wall 222 includes a thermally conductive material (e.g., aluminum, steel, and/or another suitable thermally conductive material), the heat in the rising air may conduct from an interior side of the wall 222 to an exterior side of the wall 222 exposed to an ambient (e.g., surrounding, etc.) environment where passing air (e.g., wind) may cool the exterior side of the wall. Additionally, if the ambient environment is cooler than the wall 222, heat may be radiated from the wall 222 to the ambient environment.

In addition to transferring heat away from the cabinet 200, one or more of the walls 214, 216, 218, 220, 222 defining the secondary space 234 may create a solar shield for the cabinet 200. In such examples, these walls may insulate the cabinet 200 and therefore reduce solar loading from, for example, the sun. For example, and as shown in FIGS. 2 and 3, the walls 214, 216, 218, 220, 222 are adjacent the side wall 208 of the cabinet 200. Thus, the side wall 208 may be substantially insulated from the sun. In other embodiments, the walls defining the secondary space 234 may be positioned adjacent other sides of the cabinet including, for example, adjacent the top wall 210, the side wall 204, etc.

In some embodiments, one or more of the walls of the cabinet may be formed of a high reflection coefficient material, have a high reflection coefficient material applied to the surface(s), etc. For example, one or more of the walls 214, 216, 218, 220, 222 defining the solar shield may be painted substantially white (or another suitable color having a high reflection coefficient). This may inhibit heating of the cabinet 200 via absorbed sunlight.

As shown in FIGS. 2 and 3, the walls 214, 216, 218, 220, 222 defining the secondary space 234 may be solid walls. As such, these walls (and other solid walls of the cabinet 200) may not include openings which may otherwise allow pollutants, particulate matter, etc. to enter the cabinet 200. In such examples, the cabinet 200 (and other cabinets disclosed herein) may be considered a sealed cabinet if other exterior walls of the cabinet 200 are solid walls and/or have appropriate filters, etc. covering openings.

In some embodiments, the wall 208 defining the opening 238 may include a thermally conductive material for transferring heat from the main space 232 to the secondary space 234. For example, the wall 208 may be formed of aluminum, steel and/or another suitable thermally conductive material. In such examples, the wall 208 may transfer heat (e.g., through convection, conduction, and/or radiation) from the main space 232 to the secondary space 234 as explained above.

In the example embodiment shown in FIGS. 2 and 3, the walls 212, 224, 226, 228, 230 define a chamber 236 for housing electronics equipment (e.g., batteries, etc. as further explained below). The chamber 236 is positioned below the main space 232 of the cabinet 200. In such examples, the electronics equipment may generate heat which can pass into the main space 232. As such, the electronics equipment in the cabinet 200 may be considered a heat generating component.

In some embodiments, the wall 212 positioned between the main space 232 of the chamber 236 may be a solid wall thereby isolating the main space 232 from the chamber 236. As such, undesirable substances (e.g., hydrogen gas if electronics equipment is rechargeable batteries, etc.) may not pass from the chamber 236 to the main space 232. In such examples, the chamber 236 may include one or more appropriate cooling systems if desired. For example, any one or more of the walls 224, 226, 228, 230 may include louvers and/or one or more other suitable openings for cooling purposes, exhausting undesirable gases, etc. Alternatively, the wall 212 may include one or more openings to allow heated air to rise into the main space 232 and into the secondary space 234 as explained above.

Figure 4:
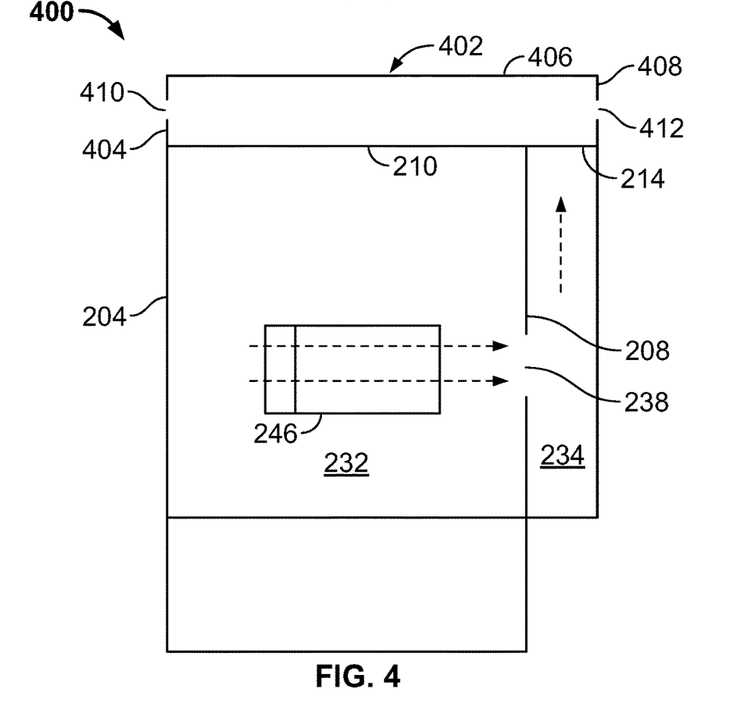
FIG. 4 is a side view of an electronics equipment cabinet similar to the cabinet of FIG. 2 but including a solar shield adjacent a top side of the cabinet according to another example embodiment.

In some embodiments, the cabinet 200 may include one or more additional systems for reducing the temperature in the cabinet 200. For example, FIG. 4 illustrates an electronics equipment cabinet 400 substantially similar to the cabinet 200 of FIGS. 2 and 3. The cabinet 400, however, includes a solar shield 402 for insulating the cabinet 400 and thereby reducing solar loading from the sun and/or other heat sources. As shown in FIG. 4, the solar shield 402 is defined by walls 210, 214, 404, 406, 408.

In the example of FIG. 4, the solar shield 402 is positioned adjacent a top side of the main space 232. In particular, the solar shield is positioned adjacent the wall 210 defining the main space 232 and the wall 214 defining the secondary space 234. Alternatively, the solar shield 402 and/or another suitable solar shield may be positioned adjacent another side of the cabinet 400 if desired. For example, the cabinet 400 may include a solar shield adjacent the side wall 204 in addition to and/or instead of the solar shield 402.

In some embodiments, the solar shield 402 may extend the entire length and width of the top surface (e.g., the walls 210, 214) of the cabinet 400 as shown in FIG. 4. In other embodiments, the solar shield 402 may extend a distance more or less than the entire length and/or width of the top surface. For example, the solar shield 402 may extend the entire length and/or width of only the wall 210 (e.g., positioned directly above the main space 232).

As shown in FIG. 4, the solar shield 402 defines two openings (e.g., one or more perforations, etc.) for allowing air to vent. For example, the walls 404, 408 include openings 410, 412, respectively. Thus, air may pass through the openings 410, 412 to remove heat from the solar shield 402. Additionally, this air passing through the solar shield 402 may remove heat from the main space 232 if heat is transferred (as explained above) from the main space 232 to the solar shield 402. Alternatively, the solar shield 402 may define more or less openings. For example, the wall 404 may include four openings and the wall 408 may include one opening. In other examples, the top wall 406 may include an opening and the wall 408 may not include an opening.

Figure 5:
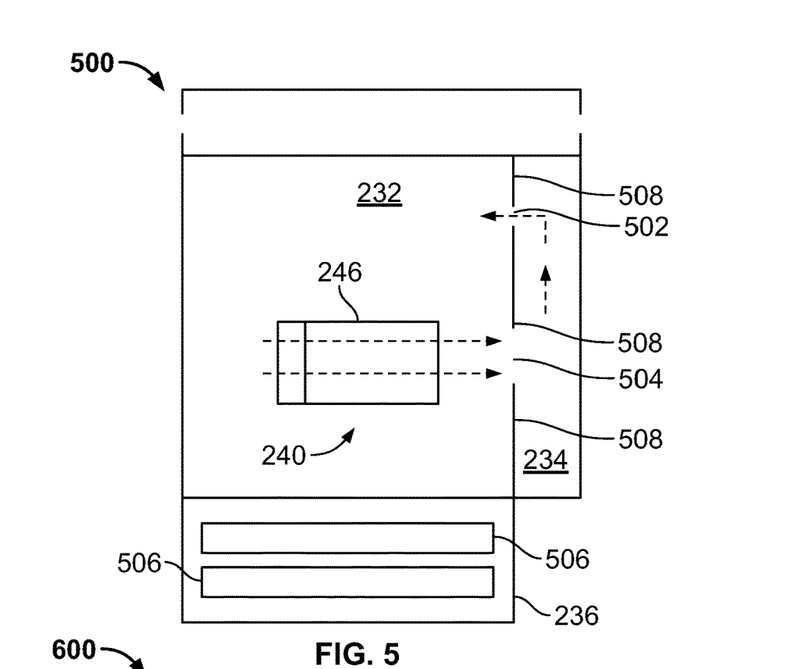
FIG. 5 is a side view of an electronics equipment cabinet similar to the cabinet of FIG. 4 but including two wall openings for allowing air to pass from one space to another space according to yet another example embodiment.

Although FIGS. 2-4 illustrate the wall 208 including one opening 238 for allowing air heated by the heat generating component 246 in the main space 232 to pass into the secondary space 234, it should be apparent to those skilled in the art that the wall 208 may include more than one opening. For example, some cabinets may include a wall for separating a main space and a secondary space that has two openings, four openings, nine openings, etc. By way of an example, FIG. 5 illustrates an electronics equipment cabinet 500 substantially similar to the cabinet 400 of FIG. 4. The cabinet 500 of FIG. 5, however, includes two openings for allowing air to pass into and out of the secondary space 234.

In particular, the cabinet 500 includes a wall 508 substantially similar to the wall 208 of FIGS. 2-4, but defines an opening 502 and an opening 504 positioned below the opening 502. For example, the opening 504 (which may be similar to the opening 238 of FIGS. 2-4) may be substantially aligned with the heat generating module 240. This arrangement may allow air heated by the heat generating component 246 of the module 240 to pass into the secondary space 234 as explained above.

As shown in FIG. 5, heated air in the secondary space 234 may rise towards a top portion of the secondary space 234 and through the opening 502. As such, the opening 502 may allow air to flow from the secondary space 234 to the main space 232. The air flowing through the opening 502 may be cooler than the air flowing through the opening 504 due to the heat transferring characteristics of the walls defining the secondary space 234 as explained above. In such examples, the two openings 502, 504 may create a circulating air flow path (e.g., a counterclockwise air flow path as shown by the arrows of FIG. 5) to help reduce a temperature in the cabinet 500.

In some embodiments, the size of the opening 504 and the size of the opening 502 may be different. In particular, and as shown in FIG. 5, the opening 504 is larger than the opening 502. For example, the opening 504 may have a diameter larger than the diameter of the opening 502. Alternatively, the size of the openings 502, 504 may be substantially the same, the opening 504 may be smaller than the opening 502, etc.

Figure 6:
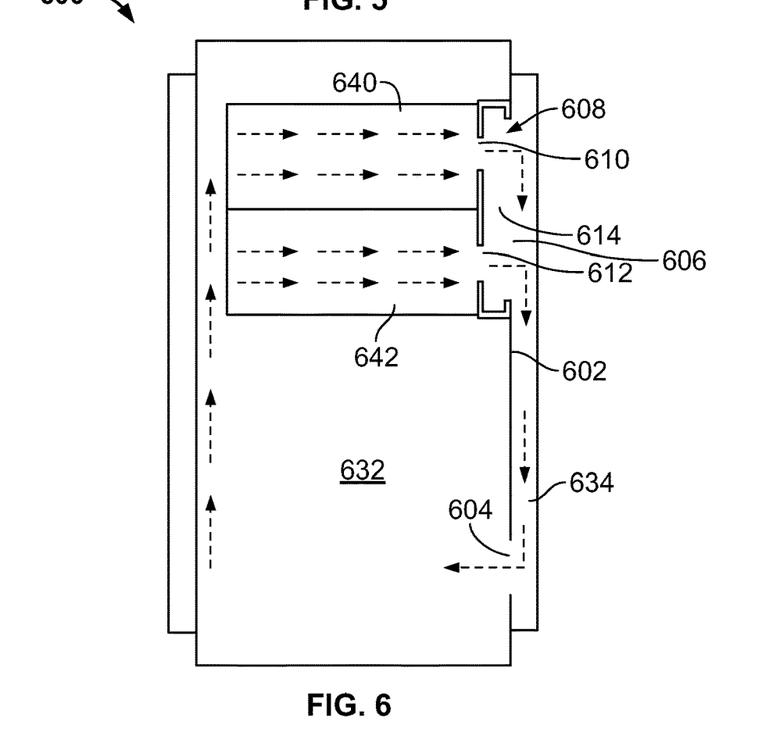
FIG. 6 is a side view of an electronics equipment cabinet including a solar shield, two heat generating modules, and a heat collector for diverting heated air into the solar shield according to another example embodiment.

In other embodiments, one or more heat generating modules may be positioned adjacent to (e.g., aligned with) a different opening. For example, FIG. 6 illustrates an electronics equipment cabinet 600 including a main space 632, a secondary space 634, and heat generating modules 640, 642 positioned in the main space 632. The spaces 632, 634 are defined by various walls of the cabinet 600 including, for example, a wall 602 separating the two spaces 632, 634. The various walls of FIG. 6 may be similar to the walls of FIGS. 2-5, and therefore include heat transferring characteristics as explained above.

As shown in FIG. 6, the wall 602 includes two openings 604, 606, which may be substantially similar to the openings 502, 504 of FIG. 5. For example, and as shown in FIG. 6, the opening 606 is positioned above the opening 604 and may be substantially aligned with the heat generating modules 640, 642. Thus, one or more fans (not shown) of each heat generating module 640, 642 may be substantially aligned with the opening 606. In other embodiments, one or both fans, heat generating modules 640, 642, etc. may be offset as explained above.

In the example of FIG. 6, the fans force air to pass by heat generating component(s) (not shown) of one or both modules 640, 642. The heated air may enter the secondary space 634 via the opening 606, move downward towards a bottom portion of the space 634, and return to the main space 632 via the opening 604. For example, the fan(s) may draw air from the secondary space 634 via the opening 604 and towards an inlet side of the modules 640, 642 to create an airflow loop within the cabinet 600.

In such examples, the two openings 604, 606 create a circulating air flow path (e.g., a clockwise air flow path as shown by the arrows of FIG. 6) to help reduce a temperature in the cabinet 600. For example, the air passing through the secondary space 634 may cool due to, for example, heat transferring characteristics (as explained above) of the walls defining the space 634. Additionally, the heated air may cool when it is mixed with air near a bottom portion of the cabinet 600.

Additionally, and as shown in FIG. 6, the cabinet 600 may include a heat collector 608 positioned adjacent an outlet side of the heat generating modules 640, 642. In particular, the heat collector 608 is positioned between the heat generating modules 640, 642 and the opening 606 of the wall 602. As shown in FIG. 6, the heat collector 608 extends between a top of the heat generating module 640 (e.g., the top most module) and a bottom of the heat generating module 642 (e.g., the bottom most module). In other embodiments, the heat collector 608 may extend past one or both modules 640, 642. The heat collector 608 may include any suitable material including, for example, material (e.g., aluminum, steel, etc.) designed to enhance thermal dissipation.

The heat collector 608 may divert air heated by the heat generating components of one or both modules 640, 642 into the secondary space 634 as explained above. For example, the heat collector 608 may include structure that diverts the air into the opening 606 as explained above. In some embodiments, the heat collector 608 may include any suitable duct, column, tube, tunnel, etc. capable of diverting air from one location to another. For example, and as shown in FIG. 6, the heat collector 608 may include openings 610, 612 adjacent the outlet side of the modules 640, 642, respectively, for collecting the heated air, and a tunnel like structure 614 positioned between the openings 610, 612 and the opening 606 of the wall 602 for diverting the heated air into the secondary space 634.

Similar to the walls of FIGS. 2 and 3, one or more of the walls defining the secondary space 634 of FIG. 6 may create a solar shield 616 for the cabinet 600. Additionally, the cabinet 600 may include a solar shield 618 adjacent another side of the cabinet 600. For example, and as shown in FIG. 6, the solar shield 618 is adjacent an opposing side of the cabinet 600 relative to the solar shield 616. The solar shields 616, 618 may include similar characteristics as the solar shield of FIGS. 2 and 3 explained above.

Figure 7:
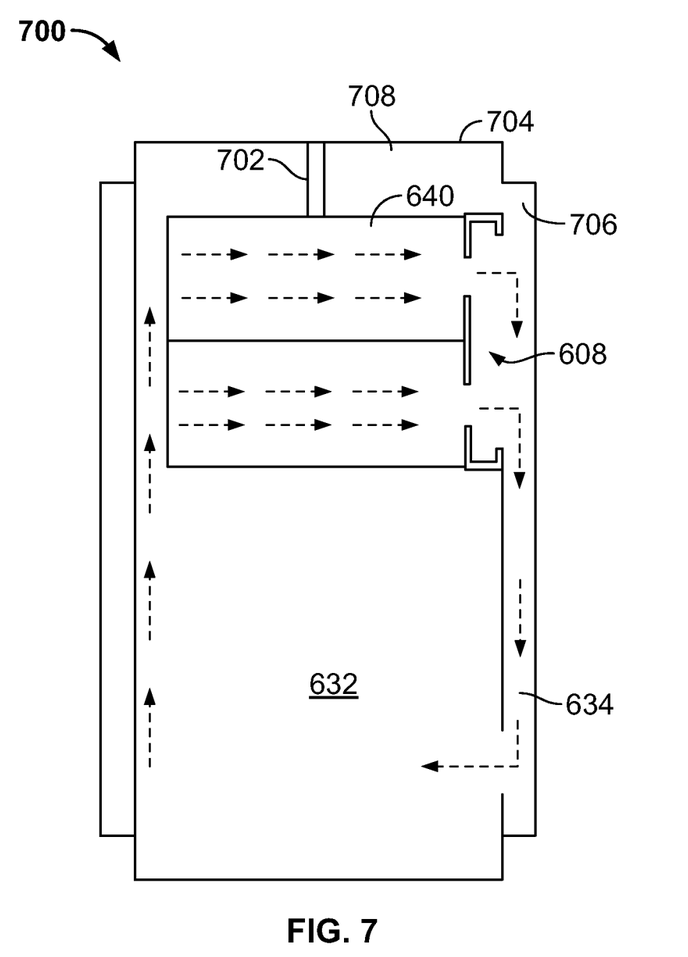
FIG. 7 is a side view of an electronics equipment cabinet similar to the cabinet of FIG. 6 but including a block plate positioned between one of the heat generating modules and a top wall of the cabinet.

FIG. 7 illustrates another example electronics equipment cabinet 700 substantially similar to the cabinet 600 of FIG. 6, but including a block plate 702. As shown in FIG. 7, the block plate 702 extends above the heat generating module 640 to a top of the cabinet 700. In particular, the block plate 702 extends between a top side of the module 640 and a top wall 704 of the cabinet 700.

The block plate 702 may inhibit air from the outlet sides of one or both heat generating modules 640, 642 from being recirculated to the inlet sides of the modules without first passing through a bottom portion of the cabinet 700. For example, in some embodiments the interior structures of the cabinet 700 may not form an air tight seal. In such examples, the cabinet 700 may include one or more openings 706 between the heat collector 608 and a portion 708 of the cabinet 700 above the modules 640, 642. By employing the block plate 702, heated air is inhibited from passing to the inlet sides of the modules 640, 642 via the portion 708 and instead is forced to pass through the secondary space 634 and a bottom portion of the main space 632 as explained above.

The block plate 702 may include any material suitable for preventing air from flowing through the block plate, such as aluminum, steel, plastic, etc. Although FIG. 7 illustrates one block plate 702 positioned near a middle portion of the module 640, the block plate 702 (and/or additional block plates) may be positioned adjacent side portions of the module 640.

Although FIGS. 2-7 illustrate cabinets including particular features, it should be apparent that any one of the cabinets disclosed herein may include (or not include) any one or more of the features disclosed herein, additional features, etc. For example, in some embodiments, the cabinet 500 of FIG. 5 may not include the solar shield 402, the cabinet 200 of FIGS. 2 and 3 may include solar shields adjacent various exterior walls, etc.

Testing has shown the cabinets disclosed herein that do not include additional active cooling components besides those existing in the heat generating modules may experience satisfactory and/or equivalent cooling as traditional cabinets including active cooling components such as heat exchangers, etc.

By way of example, Table 1 below provides average temperature readings (in degrees Celsius) of different cabinets (e.g., labeled as Cases A, B and C) including a rectifier module having a fan (as explained above). The temperature readings are from various locations on each cabinet. Case A represents a traditional cabinet including a 455 W heat exchanger located on a door of the cabinet with the cabinet experiencing a 360 W heat load. Case B represents a cabinet substantially similar to the cabinet 400 of FIG. 4 with the opening 238 on a rear side of the cabinet and a 95 W heat load (e.g., a solar load) provided to the rear side. Case C represents a cabinet substantially similar to the cabinet 400 of FIG. 4 with the opening 238 on the rear side of the cabinet and a 105 W heat load provided to a front side of the cabinet.

TABLE 1

| Location | Average Temperature (° C.) | | |
| --- | --- | --- | --- |
| | Case A | Case B | Case C |
| Rectifier Module Intake | 58 | 65 | 66 |
| Rectifier Module Exit | 65 | 67 | 68 |
| Cabinet Top | 62 | 66 | 66 |
| Battery Chamber Right | 53 | 55 | 55 |
| Battery Chamber Left | 53 | 55 | 55 |
| Battery Chamber Front | 53 | 55 | 55 |
| Battery Chamber Rear | 52 | 54 | 53 |
| Battery Chamber Top | 62 | 61 | 62 |

Table 2 provides another example of a temperature comparison among different cabinet embodiments (including some of the cabinets disclosed herein) and a traditional cabinet. Similar to Table 1, the temperatures listed below are average temperature readings (in degrees Celsius) of different cabinets (e.g., labeled as Cases 1, 2, 3, etc.). Each of the cases of Table 2 represents a cabinet including a rectifier module having a fan (as explained above) and a front side that receives a 46 degrees Celsius solar load Case 1 represents a traditional cabinet including a 220 W heat exchanger (not operating) located on a door of the cabinet. Case 2 represents a cabinet substantially similar to the cabinet 200 of FIGS. 2 and 3, Cases 3 and 4 represent a cabinet substantially similar to the cabinet 400 of FIG. 4, Case 5 represent a cabinet substantially similar to the cabinet 500 of FIG. 5 but where the openings 502, 504 have the same size, and Case 6 represent a cabinet substantially similar to the cabinet 500 of FIG. 5. 220 W of heat was removed from the cabinet of Case 2, 186 W of heat was removed from the cabinet of Case 3, and 270 W of heat was removed from the cabinets of Cases 4, 5 and 6.

TABLE 2

| Location | Average Temperature (° C.) | | | | | |
|---|---|---|---|---|---|---|
| | Case 1 | Case 2 | Case 3 | Case 4 | Case 5 | Case 6 |
| Rectifier Intake | 70 | 78 | 73 | 79 | 78 | 79 |
| Rectifier Exit | — | 82 | 76 | 83 | 82 | 83 |
| Cabinet Top | 69 | 78 | 73 | 77 | 77 | 77 |
| Battery Chamber Right | — | 54 | 54 | 55 | 54 | 54 |
| Battery Chamber Left | — | 54 | 54 | 54 | 54 | 54 |
| Battery Chamber Front | — | 54 | 53 | 54 | 54 | 54 |
| Battery Chamber Rear | — | 53 | 53 | 53 | 53 | 53 |
| Battery Chamber Top | 60 | 66 | 65 | 67 | 66 | 66 |

Table 3 provides yet another example of a temperature comparison between an example cabinet disclosed herein and a traditional cabinet. Similar to Tables 1 and 2, the temperatures listed below are average temperature readings (in degrees Celsius) at particular locations of each cabinet (e.g., labeled as Cases X and Y). Case X represents a traditional cabinet including two rectifier modules and Case Y represents a cabinet substantially similar to the cabinet 600 of FIG. 6. In particular, the rectifier modules 1, 2 are similar to the heat generating modules 640, 642, respectively.

TABLE 3

| Location | Average Temperature (° C.) | |
|---|---|---|
| | Case X | Case Y |
| Rectifier Module 1 Intake | 68 | 64 |
| Rectifier Module 1 Exit | 72 | 69 |
| Rectifier Module 2 Intake | 69 | 65 |
| Rectifier Module 2 Exit | 73 | 70 |

As shown in Tables 1-3, the circulating airflow may generate a substantially uniform temperature in the cabinets. For example, the temperatures near a top portion of a respective cabinet are substantially uniform and the temperatures near a bottom portion of a respective cabinet are substantially uniform.

Additionally, and as shown in Tables 1-3, the average temperature measured at an intake of a rectifier module is consistently lower than the temperature measured at an exit of the rectifier module. Thus, by using the features disclosed herein, heated air at an exit side of a heat generating component (e.g., the Rectifier Module, etc.) may be cooled before recirculating and reentering an intake of the heat generating component. Accordingly, the cabinets disclosed herein may reduce a temperature in the cabinet without an active cooling device (e.g., one or more heat exchangers, fans, thermoelectric coolers, etc.) within the cabinets and external to the heat generating module(s).

The walls (e.g., the wall 208, 508, 602) disclosed herein for separating a main space and a secondary space may have any suitable dimensions. For example, a wall separating a main space and a secondary space may have a thickness of about 1.2 mm. This thickness may be more or less than a thickness of other walls in the cabinet. In some embodiments, the thickness of this wall may depend on the material used (e.g., the thermal conductivity of the material, etc.), desired cooling, desired cost, etc. In some examples, a reduced thickness of this wall may decrease the weight of the cabinet, costs, etc. compared to other known cabinets.

Additionally, the openings disclosed herein (e.g., the openings 238, 410, 412, 504, 604, 606, etc.) may have any suitable size and/or shape. For example, the size and/or shape of the openings may depend on desired air flow, on other cabinet cooling features (e.g. the size and/or shape of other openings, etc.), the heat generating components, etc.

Further, although FIGS. 2-5 illustrate the cabinets including some sides formed of two walls, it should be apparent that any of the sides of the cabinet may be formed of a single wall, more than two walls, etc. For example, in some embodiments, the top surface of the cabinet 200 may include one wall (e.g., a single piece of sheet metal and/or another suitable material) instead of the two walls 210, 214.

The heat generating modules disclosed herein may be any suitable module including a heat generating component and a fan. For example, the heat generating modules may be a rectifier module (e.g., a NetSure™ series power system, etc.) including one or more rectifiers as a heat generating component and a fan. Additionally, and as explained above, the fans may be positioned adjacent an inlet side, an outlet side, etc. of the modules.

In addition, any one of the cabinets disclosed herein may include one or more electronics equipment (e.g., batteries, control circuits, converters such as rectifiers, inverters, DC/DC converters, etc.) in addition to the heat generating modules explained above. For example, and as shown in FIG. 5, the cabinet 500 includes the chamber 236 of FIGS. 2 and 3 positioned below the main space 232. The chamber 236 of FIG. 5 includes battery stacks 506 (e.g., one or more rechargeable batteries) for providing power (e.g., backup power, etc.) when needed. In some examples, the batteries of the battery stacks 506 may generate heat that can pass into the main space 232 as explained above. In such cases, the batteries may be considered a heat generating component.

The cooling features disclosed herein may be employed in any suitable electronics equipment cabinet. For example, the cooling features may be employed in telecommunications cabinets, battery cabinets, server cabinets, data center cabinets, server cabinets (e.g., server racks, etc.), and/or any other cabinet including one or more heat generating components. In some embodiments, the cabinets may include one or more power converters (e.g., rectifiers, DC/DC converters, inverters, etc.), control circuits (e.g., processors, etc.), batteries (e.g., rechargeable batteries, etc.), memory, switches, optical fiber cables, transmitters, receivers and/or other suitable electronics equipment. The cabinets may be sealed cabinets, indoor cabinets, outdoor cabinets, outside plant (OSP) cabinets, etc.

By employing one or more of the cooling features disclosed herein, cabinets located in an external environment may be cooled without utilizing additional active cooling components (e.g., heat exchangers, additional fans, etc.). As such, these cabinets may consume less energy, produce less acoustic noise, etc. than known cabinets. Additionally, because less active cooling components are employed, the cabinets disclosed herein (and its cooling components) may be more reliable and therefore require less maintenance than other cabinets utilizing various active cooling components.

Further, the cooling features disclosed herein may occupy less space, weigh less, etc. than other known cooling features. As such, the cabinets including the example cooling features may have more available space, weigh less, etc. than other known cabinets. Additionally, one or more of the cooling features cooling feature(s) may be effective in a cabinet having a heat load up to about 300 W.

Further, one or more of the cooling features disclosed herein may effectively cool a cabinet and provide substantial cost savings. For example, heat exchanger(s) in a conventional cabinet may cost between about 40 percent and about 60 percent of the overall cabinet cost depending on, for example, the size of the cabinet, the required power to operate the heat exchanger(s), the cost of the heat exchanger(s), etc. Cabinets including one or more of the disclosed cooling features, however, may be cooled to between about 20 percent and 30 percent of conventional cabinets including heat exchangers while saving between about 30 percent and about 50 percent on costs. In some examples, the costs may be reduced by about 70 percent from some active cooling solutions.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An electronics equipment cabinet for housing one or more heat generating components, the electronics equipment cabinet comprising:
a first plurality of walls defining a first space of the electronics equipment cabinet configured to house one or more heat generating components and a second space of the electronics equipment cabinet adjacent the first space, at least one wall of the first plurality of walls separating the first space and the second space, the at least one wall defining a first opening therethrough and a second opening therethrough and positioned below the first opening for allowing air to flow from the second space to the first space,
at least one heat generating module positioned in the first space and including a second plurality of walls different than the first plurality of walls, the at least one heat generating module having an inlet side, an outlet side opposing the inlet side, a heat generating component positioned between the inlet side and the outlet side, and an internal fan positioned between the inlet side and the outlet side of the at least one heat generating module for directing air heated by the heat generating component into the second space via the first opening through said at least one wall, and
a heat collector positioned adjacent the outlet side of the heat generating module and configured to divert air heated by the heat generating component into the second space via the first opening of the at least one wall,
wherein one or more walls of the first plurality of walls defining the second space include a thermally conductive material for transferring heat from the second space to a surrounding environment external to the electronics equipment cabinet to reduce a temperature in the cabinet.

2. The electronics equipment cabinet of claim 1 wherein the first opening is substantially aligned with the internal fan.

3. The electronics equipment cabinet of claim 1 wherein the first opening is larger than the second opening.

4. The electronics equipment cabinet of claim 1 wherein the internal fan of the heat generating module is configured to draw air from the second space via the second opening to create an airflow loop within the cabinet.

5. The electronics equipment cabinet of claim 1 wherein the thermally conductive material includes aluminum.

6. The electronics equipment cabinet of claim 1 wherein the first space and the second space of the electronics equipment cabinet are sealed spaces.

7. The electronics equipment cabinet claim 1 further comprising a solar shield positioned adjacent at least one of the first plurality of walls defining the first space.

8. The electronics equipment cabinet of claim 7 wherein the solar shield defines one or more openings for allowing air to vent therethrough.

9. The electronics equipment cabinet claim 1 wherein the cabinet is configured to reduce a temperature in the cabinet without an active cooling device within the cabinet and external to the heat generating module.

10. The electronics equipment cabinet of claim 9 wherein the at least one wall includes a thermally conductive material for transferring heat from the first space to the second space.

11. The electronics equipment cabinet of claim 9 further comprising a solar shield positioned adjacent at least one of the first plurality of walls defining the first space.

12. The electronics equipment cabinet of claim 11 wherein the solar shield defines one or more openings for allowing air to vent.

13. The electronics equipment cabinet of claim 9 wherein the first plurality of walls includes a top wall and one or more side walls extending from the top wall, and wherein the at least one wall separating the first space and the second space includes one of the side walls extending from the top wall so that air directed by the internal fan flows in a substantially horizontal direction between the first space and the second space.

14. The electronics equipment cabinet of claim 9 wherein the first opening is substantially aligned with the internal fan.

15. The electronics equipment cabinet of claim 9 wherein the internal fan of the heat generating module is configured to draw air from the second space via the second opening to create an airflow loop within the cabinet.

16. The electronics equipment cabinet of claim 9 wherein the first space and the second space of the electronics equipment cabinet are sealed spaces.

17. The electronics equipment cabinet of claim 1 wherein the internal fan of the heat generating module is positioned near the inlet side of the at least one heat generating module.

18. The electronics equipment cabinet of claim 1 wherein the at least one wall includes a thermally conductive material for transferring heat from the first space to the second space.

19. The electronics equipment cabinet of claim 18 wherein the thermally conductive material of the at least one wall includes aluminum.

20. The electronics equipment cabinet of claim 1 wherein the first plurality of walls includes a top wall and one or more side walls extending from the top wall, and wherein the at least one wall separating the first space and the second space includes one of the side walls extending from the top wall so that air directed by the internal fan flows in a substantially horizontal direction between the first space and the second space.

* * * * *